United States Patent
Cubaynes et al.

(10) Patent No.: US 12,125,673 B2
(45) Date of Patent: *Oct. 22, 2024

(54) PULSED VOLTAGE SOURCE FOR PLASMA PROCESSING APPLICATIONS

(71) Applicant: Applied Materials, Inc., Santa Clara, CA (US)

(72) Inventors: Fabrice Cubaynes, Saint-Jean-Lagineste (FR); Dmitry Grishin, Saint Cere (FR)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/507,260

(22) Filed: Nov. 13, 2023

(65) Prior Publication Data

US 2024/0087848 A1 Mar. 14, 2024

Related U.S. Application Data

(63) Continuation of application No. 17/961,452, filed on Oct. 6, 2022, now Pat. No. 11,887,813, which is a
(Continued)

(51) Int. Cl.
*H01J 37/32* (2006.01)
*H02M 3/24* (2006.01)
*H03K 17/687* (2006.01)

(52) U.S. Cl.
CPC .... *H01J 37/32128* (2013.01); *H03K 17/6871* (2013.01); *H02M 3/24* (2013.01)

(58) Field of Classification Search
CPC .......... H01J 37/32128; H03K 17/6871; H02M 3/24; H02M 7/49
See application file for complete search history.

(56) References Cited

U.S. PATENT DOCUMENTS

| 4,070,589 A | 1/1978 | Martinkovic |
| 4,340,462 A | 7/1982 | Koch |

(Continued)

FOREIGN PATENT DOCUMENTS

| CN | 101990353 A | 3/2011 |
| CN | 102084024 A | 6/2011 |

(Continued)

OTHER PUBLICATIONS

Wang, S.B., et al.—"Control of ion energy distribution at substrates during plasma processing," Journal of Applied Physics, vol. 88, No. 2, Jul. 15, 2000, pp. 643-646.

(Continued)

*Primary Examiner* — Metasebia T Retebo
(74) *Attorney, Agent, or Firm* — Patterson + Sheridan, LLP

(57) ABSTRACT

Embodiments provided herein generally include apparatus, e.g., plasma processing systems, and methods for the plasma processing of a substrate in a processing chamber. Some embodiments are directed to a waveform generator. The waveform generator generally includes a first voltage stage having: a first voltage source; a first switch; and a second switch, where a first terminal of the first voltage source is coupled to a first terminal of the first switch, and where a second terminal of the first voltage source is coupled to a first terminal of the second switch. The waveform generator also includes a current stage coupled to a common node between second terminals of the first switch and the second switch, the current stage having a current source and a third switch coupled to the current source.

19 Claims, 6 Drawing Sheets

Related U.S. Application Data continuation of application No. 17/356,446, filed on Jun. 23, 2021, now Pat. No. 11,569,066.

(56) References Cited

U.S. PATENT DOCUMENTS

| | | |
|---|---|---|
| 4,464,223 A | 8/1984 | Gorin |
| 4,504,895 A | 3/1985 | Steigerwald |
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,242,561 A | 9/1993 | Sato |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert |
| 7,509,105 B2 | 3/2009 | Ziegler |
| 7,512,387 B2 | 3/2009 | Glueck |
| 7,535,688 B2 | 5/2009 | Yokouchi et al. |
| 7,569,791 B2 | 8/2009 | Smith et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |

(56) References Cited

U.S. PATENT DOCUMENTS

| | | |
|---|---|---|
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | Mcnall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,962,488 B2 | 2/2015 | Liao et al. |
| 8,963,377 B2 | 2/2015 | Ziemba et al. |
| 8,979,842 B2 | 3/2015 | Mcnall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu et al. |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |

(56) References Cited

U.S. PATENT DOCUMENTS

| | | | |
|---|---|---|---|
| 9,972,503 B2 | 5/2018 | Tomura et al. | |
| 9,997,374 B2 | 6/2018 | Takeda et al. | |
| 10,020,800 B2 | 7/2018 | Prager et al. | |
| 10,026,593 B2 | 7/2018 | Alt et al. | |
| 10,027,314 B2 | 7/2018 | Prager et al. | |
| 10,041,174 B2 | 8/2018 | Matsumoto et al. | |
| 10,042,407 B2 | 8/2018 | Grede et al. | |
| 10,063,062 B2 | 8/2018 | Voronin et al. | |
| 10,074,518 B2 | 9/2018 | Van Zyl | |
| 10,085,796 B2 | 10/2018 | Podany | |
| 10,090,191 B2 | 10/2018 | Tomura et al. | |
| 10,102,321 B2 | 10/2018 | Povolny et al. | |
| 10,109,461 B2 | 10/2018 | Yamada et al. | |
| 10,115,567 B2 | 10/2018 | Hirano et al. | |
| 10,115,568 B2 | 10/2018 | Kellogg et al. | |
| 10,176,970 B2 | 1/2019 | Nitschke | |
| 10,176,971 B2 | 1/2019 | Nagami | |
| 10,181,392 B2 | 1/2019 | Leypold et al. | |
| 10,199,246 B2 | 2/2019 | Koizumi et al. | |
| 10,217,618 B2 | 2/2019 | Larson et al. | |
| 10,217,933 B2 | 2/2019 | Nishimura et al. | |
| 10,224,822 B2 | 3/2019 | Miller et al. | |
| 10,229,819 B2 | 3/2019 | Hirano et al. | |
| 10,249,498 B2 | 4/2019 | Ventzek et al. | |
| 10,268,846 B2 | 4/2019 | Miller et al. | |
| 10,269,540 B1 | 4/2019 | Carter et al. | |
| 10,276,420 B2 | 4/2019 | Ito et al. | |
| 10,282,567 B2 | 5/2019 | Miller et al. | |
| 10,283,321 B2 | 5/2019 | Yang et al. | |
| 10,290,506 B2 | 5/2019 | Ranjan et al. | |
| 10,297,431 B2 | 5/2019 | Zelechowski et al. | |
| 10,304,661 B2 | 5/2019 | Ziemba et al. | |
| 10,304,668 B2 | 5/2019 | Coppa et al. | |
| 10,312,048 B2 | 6/2019 | Dorf et al. | |
| 10,312,056 B2 | 6/2019 | Collins et al. | |
| 10,320,373 B2 | 6/2019 | Prager et al. | |
| 10,332,730 B2 | 6/2019 | Christie | |
| 10,340,123 B2 | 7/2019 | Ohtake | |
| 10,348,186 B2 | 7/2019 | Schuler et al. | |
| 10,354,839 B2 | 7/2019 | Alt et al. | |
| 10,373,755 B2 | 8/2019 | Prager et al. | |
| 10,373,804 B2 | 8/2019 | Koh et al. | |
| 10,373,811 B2 | 8/2019 | Christie et al. | |
| 10,381,237 B2 | 8/2019 | Takeda et al. | |
| 10,382,022 B2 | 8/2019 | Prager et al. | |
| 10,387,166 B2 | 8/2019 | Preston et al. | |
| 10,388,544 B2 | 8/2019 | Ui et al. | |
| 10,389,345 B2 | 8/2019 | Ziemba et al. | |
| 10,410,877 B2 | 9/2019 | Takashima et al. | |
| 10,431,437 B2 | 10/2019 | Gapi 70nski et al. | |
| 10,438,797 B2 | 10/2019 | Cottle et al. | |
| 10,446,453 B2 | 10/2019 | Coppa et al. | |
| 10,447,174 B1 | 10/2019 | Porter, Jr. et al. | |
| 10,448,494 B1 | 10/2019 | Dorf et al. | |
| 10,448,495 B1 | 10/2019 | Dorf et al. | |
| 10,453,656 B2 | 10/2019 | Carducci et al. | |
| 10,460,910 B2 | 10/2019 | Ziemba et al. | |
| 10,460,911 B2 | 10/2019 | Ziemba et al. | |
| 10,460,916 B2 | 10/2019 | Boyd, Jr. et al. | |
| 10,483,089 B2 | 11/2019 | Ziemba et al. | |
| 10,483,100 B2 | 11/2019 | Ishizaka et al. | |
| 10,510,575 B2 | 12/2019 | Kraus et al. | |
| 10,516,388 B1 * | 12/2019 | Kim | H03K 3/021 |
| 10,522,343 B2 | 12/2019 | Tapily et al. | |
| 10,535,502 B2 | 1/2020 | Carducci et al. | |
| 10,546,728 B2 | 1/2020 | Carducci et al. | |
| 10,553,407 B2 | 2/2020 | Nagami et al. | |
| 10,555,412 B2 | 2/2020 | Dorf et al. | |
| 10,580,620 B2 | 3/2020 | Carducci et al. | |
| 10,593,519 B2 | 3/2020 | Yamada et al. | |
| 10,607,813 B2 | 3/2020 | Fairbairn et al. | |
| 10,607,814 B2 | 3/2020 | Ziemba et al. | |
| 10,631,395 B2 | 4/2020 | Sanders et al. | |
| 10,658,189 B2 | 5/2020 | Hatazaki et al. | |
| 10,659,019 B2 | 5/2020 | Slobodov et al. | |
| 10,665,434 B2 | 5/2020 | Matsumoto et al. | |
| 10,666,198 B2 | 5/2020 | Prager et al. | |
| 10,672,589 B2 | 6/2020 | Koshimizu et al. | |
| 10,672,596 B2 | 6/2020 | Brcka | |
| 10,672,616 B2 | 6/2020 | Kubota | |
| 10,685,807 B2 | 6/2020 | Dorf et al. | |
| 10,707,053 B2 | 7/2020 | Urakawa et al. | |
| 10,707,054 B1 | 7/2020 | Kubota | |
| 10,707,055 B2 | 7/2020 | Shaw et al. | |
| 10,707,086 B2 | 7/2020 | Yang et al. | |
| 10,707,090 B2 | 7/2020 | Takayama et al. | |
| 10,707,864 B2 | 7/2020 | Miller et al. | |
| 10,714,372 B2 | 7/2020 | Chua et al. | |
| 10,720,305 B2 | 7/2020 | Van Zyl | |
| 10,734,906 B2 | 8/2020 | Miller et al. | |
| 10,748,746 B2 | 8/2020 | Kaneko et al. | |
| 10,755,894 B2 | 8/2020 | Hirano et al. | |
| 10,763,150 B2 | 9/2020 | Lindley et al. | |
| 10,773,282 B2 | 9/2020 | Coppa et al. | |
| 10,774,423 B2 | 9/2020 | Janakiraman et al. | |
| 10,777,388 B2 | 9/2020 | Ziemba et al. | |
| 10,790,816 B2 | 9/2020 | Ziemba et al. | |
| 10,791,617 B2 | 9/2020 | Dorf et al. | |
| 10,796,887 B2 | 10/2020 | Prager et al. | |
| 10,804,886 B2 | 10/2020 | Miller et al. | |
| 10,811,227 B2 | 10/2020 | Van Zyl et al. | |
| 10,811,228 B2 | 10/2020 | Van Zyl et al. | |
| 10,811,229 B2 | 10/2020 | Van Zyl et al. | |
| 10,811,230 B2 | 10/2020 | Ziemba et al. | |
| 10,811,296 B2 | 10/2020 | Cho et al. | |
| 10,847,346 B2 | 11/2020 | Ziemba et al. | |
| 10,892,140 B2 | 1/2021 | Ziemba et al. | |
| 10,892,141 B2 | 1/2021 | Ziemba et al. | |
| 10,896,807 B2 | 1/2021 | Fairbairn et al. | |
| 10,896,809 B2 | 1/2021 | Ziemba et al. | |
| 10,903,047 B2 | 1/2021 | Ziemba et al. | |
| 10,904,996 B2 | 1/2021 | Koh et al. | |
| 10,916,408 B2 | 2/2021 | Dorf et al. | |
| 10,923,320 B2 | 2/2021 | Koh et al. | |
| 10,923,321 B2 | 2/2021 | Dorf et al. | |
| 10,923,367 B2 | 2/2021 | Lubomirsky et al. | |
| 10,923,379 B2 | 2/2021 | Liu et al. | |
| 10,971,342 B2 | 4/2021 | Engelstaedter et al. | |
| 10,978,274 B2 | 4/2021 | Kubota | |
| 10,978,955 B2 | 4/2021 | Ziemba et al. | |
| 10,985,740 B2 | 4/2021 | Prager et al. | |
| 10,991,553 B2 | 4/2021 | Ziemba et al. | |
| 10,991,554 B2 | 4/2021 | Zhao et al. | |
| 10,998,169 B2 | 5/2021 | Ventzek et al. | |
| 11,004,660 B2 | 5/2021 | Prager et al. | |
| 11,011,349 B2 | 5/2021 | Brouk et al. | |
| 11,075,058 B2 | 7/2021 | Ziemba et al. | |
| 11,095,280 B2 | 8/2021 | Ziemba et al. | |
| 11,101,108 B2 | 8/2021 | Slobodov et al. | |
| 11,108,384 B2 | 8/2021 | Prager et al. | |
| 11,476,090 B1 | 10/2022 | Ramaswamy et al. | |
| 11,569,066 B2 | 1/2023 | Cubaynes et al. | |
| 11,887,813 B2 * | 1/2024 | Cubaynes | H01J 37/32128 |
| 2001/0003298 A1 | 6/2001 | Shamouilian et al. | |
| 2001/0009139 A1 | 7/2001 | Shan et al. | |
| 2001/0033755 A1 | 10/2001 | Ino et al. | |
| 2002/0069971 A1 | 6/2002 | Kaji et al. | |
| 2002/0078891 A1 | 6/2002 | Chu et al. | |
| 2003/0026060 A1 | 2/2003 | Hiramatsu et al. | |
| 2003/0029859 A1 | 2/2003 | Knoot et al. | |
| 2003/0049558 A1 | 3/2003 | Aoki et al. | |
| 2003/0052085 A1 | 3/2003 | Parsons | |
| 2003/0079983 A1 | 5/2003 | Long et al. | |
| 2003/0091355 A1 | 5/2003 | Jeschonek et al. | |
| 2003/0137791 A1 | 7/2003 | Arnet et al. | |
| 2003/0151372 A1 | 8/2003 | Tsuchiya et al. | |
| 2003/0165044 A1 | 9/2003 | Yamamoto | |
| 2003/0201069 A1 | 10/2003 | Johnson | |
| 2004/0040665 A1 | 3/2004 | Mizuno et al. | |
| 2004/0040931 A1 | 3/2004 | Koshiishi et al. | |
| 2004/0066601 A1 | 4/2004 | Larsen | |
| 2004/0112536 A1 | 6/2004 | Quon | |
| 2004/0223284 A1 | 11/2004 | Iwami et al. | |

(56) References Cited

U.S. PATENT DOCUMENTS

| | | |
|---|---|---|
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0271317 A1 | 11/2006 | Ammerman et al. |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima et al. |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2013/0059448 A1 | 3/2013 | Marakhtanov et al. |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1 | 5/2014 | Finley et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |

(56) References Cited

U.S. PATENT DOCUMENTS

| | | |
|---|---|---|
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0032100 A1 | 2/2018 | Kim et al. |
| 2018/0041183 A1 | 2/2018 | Mavretic et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2018/0374684 A1 | 12/2018 | Collins et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157041 A1 | 5/2019 | Zyl et al. |
| 2019/0157042 A1 | 5/2019 | Van Zyl et al. |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0259562 A1 | 8/2019 | Dorf et al. |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0041288 A1 | 2/2020 | Wang |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0111644 A1 | 4/2020 | Long et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0227230 A1 | 7/2020 | Ziemba et al. |
| 2020/0227289 A1 | 7/2020 | Song et al. |
| 2020/0234922 A1 | 7/2020 | Dorf et al. |
| 2020/0234923 A1 | 7/2020 | Dorf et al. |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0272775 A1 | 9/2021 | Koshimizu |
| 2021/0288582 A1 | 9/2021 | Ziemba et al. |
| 2021/0407769 A1 | 12/2021 | Kim et al. |
| 2023/0029754 A1 | 2/2023 | Cubaynes et al. |
| 2023/0067046 A1 | 3/2023 | Ramaswamy et al. |

FOREIGN PATENT DOCUMENTS

| | | |
|---|---|---|
| CN | 101707186 B | 2/2012 |
| CN | 105408993 A | 3/2016 |
| CN | 106206234 A | 12/2016 |
| CN | 104752134 B | 2/2017 |
| EP | 665306 A1 | 8/1995 |
| EP | 983394 A1 | 3/2000 |
| EP | 1119033 A1 | 7/2001 |
| EP | 1203441 A1 | 5/2002 |
| EP | 1214459 A1 | 6/2002 |
| EP | 1418670 A1 | 5/2004 |
| EP | 1691481 A1 | 8/2006 |
| EP | 1701376 A1 | 9/2006 |
| EP | 1708239 A1 | 10/2006 |
| EP | 1780777 A1 | 5/2007 |
| EP | 1852959 A1 | 11/2007 |
| EP | 2016610 A1 | 1/2009 |
| EP | 2096679 A1 | 9/2009 |
| EP | 2221614 A1 | 8/2010 |
| EP | 2541584 A1 | 1/2013 |
| EP | 2580368 A1 | 4/2013 |
| EP | 2612544 A1 | 7/2013 |
| EP | 2838112 A1 | 2/2015 |
| EP | 2991103 A1 | 3/2016 |
| EP | 3086359 A1 | 10/2016 |
| EP | 3396700 A1 | 10/2018 |
| EP | 3616234 A1 | 3/2020 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 4418424 B2 | 2/2010 |
| JP | 2011035266 A | 2/2011 |

(56) References Cited

FOREIGN PATENT DOCUMENTS

| | | |
|---|---|---|
| JP | 5018244 B2 | 9/2012 |
| JP | 2013122966 A | 6/2013 |
| JP | 2014112644 A | 6/2014 |
| JP | 2016-225439 A | 12/2016 |
| JP | 6396822 B2 | 9/2018 |
| JP | 2015534716 A | 3/2019 |
| JP | 6741461 B2 | 8/2020 |
| JP | 2021175250 A | 11/2021 |
| KP | 1020180012060 A | 2/2018 |
| KR | 100757347 B1 | 9/2007 |
| KR | 10-2007-0098556 A | 10/2007 |
| KR | 20160042429 A | 4/2016 |
| KR | 20200036947 A | 4/2020 |
| TJ | 201523684 A | 6/2015 |
| TW | 498706 B | 8/2002 |
| TW | 201717247 A | 5/2017 |
| TW | 201916163 A | 4/2019 |
| TW | 202044321 A | 12/2020 |
| WO | 1998053116 A1 | 11/1998 |
| WO | 2000017920 A1 | 3/2000 |
| WO | 2000030147 A1 | 5/2000 |
| WO | 2000063459 A1 | 10/2000 |
| WO | 2001005020 A1 | 1/2001 |
| WO | 2001012873 A1 | 2/2001 |
| WO | 2001013402 A1 | 2/2001 |
| WO | 2002052628 A1 | 7/2002 |
| WO | 2002054835 A2 | 7/2002 |
| WO | 2002059954 A1 | 8/2002 |
| WO | 2003037497 A2 | 5/2003 |
| WO | 2003052882 A2 | 6/2003 |
| WO | 2003054911 A2 | 7/2003 |
| WO | 2003077414 A2 | 9/2003 |
| WO | 2004084394 A1 | 9/2004 |
| WO | 2005124844 A1 | 12/2005 |
| WO | 2007118042 A2 | 10/2007 |
| WO | 2008016747 A2 | 2/2008 |
| WO | 2008050619 A1 | 5/2008 |
| WO | 2008061775 A1 | 5/2008 |
| WO | 2008061784 A1 | 5/2008 |
| WO | 2008062663 A1 | 5/2008 |
| WO | 2009012804 A1 | 1/2009 |
| WO | 2009069670 A1 | 6/2009 |
| WO | 2009111473 A2 | 9/2009 |
| WO | 2011073093 A1 | 6/2011 |
| WO | 2011087984 A2 | 7/2011 |
| WO | 2011156055 A1 | 12/2011 |
| WO | 2012030500 A1 | 3/2012 |
| WO | 2012109159 A1 | 8/2012 |
| WO | 2012122064 A1 | 9/2012 |
| WO | 2013000918 A1 | 1/2013 |
| WO | 2013016619 A1 | 1/2013 |
| WO | 2013084459 A1 | 6/2013 |
| WO | 2013088677 A1 | 6/2013 |
| WO | 2013099133 A1 | 7/2013 |
| WO | 2013114882 A1 | 8/2013 |
| WO | 2013118660 A1 | 8/2013 |
| WO | 2013125523 A1 | 8/2013 |
| WO | 2013187218 A1 | 12/2013 |
| WO | 2014035889 A1 | 3/2014 |
| WO | 2014035894 A1 | 3/2014 |
| WO | 2014035897 A1 | 3/2014 |
| WO | 2014036000 A1 | 3/2014 |
| WO | 2014124857 A2 | 8/2014 |
| WO | 2014197145 A1 | 12/2014 |
| WO | 2015060185 A1 | 4/2015 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2016059207 A1 | 4/2016 |
| WO | 2016060058 A1 | 4/2016 |
| WO | 2016060063 A1 | 4/2016 |
| WO | 2015073921 A8 | 5/2016 |
| WO | 2016104098 A1 | 6/2016 |
| WO | 2016128384 A1 | 8/2016 |
| WO | 2016131061 A1 | 8/2016 |
| WO | 2016170989 A1 | 10/2016 |
| WO | 2017172536 A1 | 10/2017 |
| WO | 2017208807 A1 | 12/2017 |
| WO | 2018048925 A1 | 3/2018 |
| WO | 2018111751 A1 | 6/2018 |
| WO | 2018170010 A1 | 9/2018 |
| WO | 2018197702 A1 | 11/2018 |
| WO | 2019036587 A1 | 2/2019 |
| WO | 2019040949 A1 | 2/2019 |
| WO | 2019099102 A1 | 5/2019 |
| WO | 2019099870 A1 | 5/2019 |
| WO | 2019185423 A1 | 10/2019 |
| WO | 2019225184 A1 | 11/2019 |
| WO | 2019239872 A1 | 12/2019 |
| WO | 2019244697 A1 | 12/2019 |
| WO | 2019244698 A1 | 12/2019 |
| WO | 2019244734 A1 | 12/2019 |
| WO | 2019245729 A1 | 12/2019 |
| WO | 2020004048 A1 | 1/2020 |
| WO | 2020017328 A1 | 1/2020 |
| WO | 2020022318 A1 | 1/2020 |
| WO | 2020022319 A1 | 1/2020 |
| WO | 2020026802 A1 | 2/2020 |
| WO | 2020036806 A1 | 2/2020 |
| WO | 2020037331 A1 | 2/2020 |
| WO | 2020046561 A1 | 3/2020 |
| WO | 2020051064 A1 | 3/2020 |
| WO | 2020095550 A1 | 5/2020 |
| WO | 2020112921 A1 | 6/2020 |
| WO | 2020121819 A1 | 6/2020 |
| WO | 2020145051 A1 | 7/2020 |
| WO | 2021003319 A1 | 1/2021 |
| WO | 2021062223 A1 | 4/2021 |
| WO | 2021097459 A1 | 5/2021 |
| WO | 2021134000 A1 | 7/2021 |

OTHER PUBLICATIONS

PCT International Search Report and Written Opinion dated Nov. 9, 2018, for International Application No. PCT/US2018/043032.
Taiwan Office Action for Application No. 107125613 dated Dec. 24, 2020, 16 pages.
PCT International Search Report and Written Opinion dated Nov. 7, 2018, for International Application No. PCT/US2018/042965.
Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.
Eagle Harbor Technologies webpage—"EHT Integrator Demonstration at DIII-D," 2015, 1 page.
Eagle Harbor Technologies webpage—"High Gain and Frequency Ultra-Stable Integrators for ICC and Long Pulse ITER Applications," 2012, 1 page.
Eagle Harbor Technologies webpage—High Gain and Frequency Ultra-Stable Integrators for Long Pulse and/or High Current Applications, 2018, 1 page.
Eagle Harbor Technologies webpage—"In Situ Testing of EHT Integrators on a Tokamak," 2015, 1 page.
Eagle Harbor Technologies webpage—"Long-Pulse Integrator Testing with DIII-D Magnetic Diagnostics," 2016, 1 page.
Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.
Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp. 1-6, 2014.
Semiconductor Components Industries, LLC (SCILLC)—"Switch-Mode Power Supply" Reference Manual, SMPSRM/D, Rev. 4, Apr. 2014, ON Semiconductor, 73 pages.

(56) References Cited

OTHER PUBLICATIONS

Sunstone Circuits—"Eagle Harbor Tech Case Study," date unknown, 4 pages.
International Search Report and Written Opinion for PCT/US2019/052067 dated Jan. 21, 2020.
Electrical 4 U webpage—"Clamping Circuit," Aug. 29, 2018, 9 pages.
Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.
PCT Notification of Transmittal of the International Search Report and the Written Opinion of the International Searching Authority for International Application No. PCT/US2019/048392; dated Dec. 16, 2019; 13 pages.
PCT International Search Report and Written Opinion dated Nov. 7, 2018, for International Application No. PCT/US2018/042961.
PCT International Search Report and Written Opinion dated Nov. 7, 2018, for International Application No. PCT/US2018/042956.
U.S. Appl. No. 62/433,204; entitled Creating Arbitrarily-Shaped Ion Energy Distribution Function (IEDF) Using Shaped-Pulse (EV) Bias; by Leonid Dorf, et al.; filed Dec. 16, 2016; 22 total pages.
U.S. Appl. No. 15/424,405; entitled System for Tunable Workpiece Biasing in a Plasma Reactor; by Travis Koh, et al., filed Feb. 3, 2017; 29 total pages.
U.S. Appl. No. 15/618,082; entitled Systems and Methods for Controlling a Voltage Waveform at a Substrate During Plasma Processing; by Leonid Dorf, et al., filed Jun. 8, 2017; 35 total pages.
PCT Notification of Transmittal of the International Search Report and the Written Opinion of the International Searching Authority for International Application No. PCT/US2018/046171; dated Nov. 28, 2018; 10 total pages.
PCT Notification of Transmittal of the International Search Report and the Written Opinion of the International Searching Authority for International Application No. PCT/US2018/046182; dated Nov. 30, 2018; 10 total pages.
Eagle Harbor Technologies presentation by Dr. Kenneth E. Miller—"The EHT Long Pulse Integrator Program," ITPA Diagnostic Meeting, General Atomics, Jun. 4-7, 2013, 18 pages.
Lin, Jianliang, et al.,—"Diamond like carbon films deposited by HiPIMS using oscillatory voltage pulses," Surface & Coatings Technology 258, 2014, published by Elsevier B.V., pp. 1212-1222.
PCT/US2020/014453 Interanational Search Report and Written Opinion dated May 14, 2020 consists of 8 pages.
S.B. Wang et al. "Ion Bombardment Energy and SiO 2/Si Fluorocarbon Plasma Etch Selectivity", Journal of Vacuum Science & Technology A 19, 2425 (2001).
Korean Office Action for 10-2020-7007495 dated Jun. 14, 2021.
Zhen-hua Bi et al., A brief review of dual-frequency capacitively coupled discharges, Current Applied Physics, vol. 11, Issue 5, Supplement, 2011, pp. S2-S8.
Chang, Bingdong, " Oblique angled plasma etching for 3D silicon structures with wiggling geometries" 31(8), [085301]. https://doi.org/10.1088/1361-6528/ab53fb. DTU Library. 2019.
Michael A. Lieberman, "A short course of the principles of plasma discharges and materials processing", Department of Electrical Engineering and Computer Sciences University of California, Berkeley, CA 94720.
Dr. Steve Sirard, "Introduction to Plasma Etching", Lam Research Corporation. 64 pages.
Zhuoxing Luo, B.S., M.S, "RF Plasma Etching With A DC Bias" A Dissertation in Physics. Dec. 1994.
Michael A. Lieberman, "Principles of Plasma Discharges and Material Processing", A Wiley Interscience Publication. 1994.

Yiting Zhang et al. "Investigation of feature orientation and consequences of ion tilting during plasma etching with a three-dimensional feature profile simulator", Nov. 22, 2016.
Richard Barnett et al. A New Plasma Source for Next Generation MEMS Deep Si Etching: Minimal Tilt, Improved Profile Uniformity and Higher Etch Rates, SPP Process Technology Systems. 2010.
The International Search Report and the Written Opinion for International Application No. PCT/US2021/040380; dated Oct. 27, 2021; 10 pages.
International Search Report and Written Opinion dated Feb. 4, 2022 for Application No. PCT/US2021/054806.
International Search Report and Written Opinion dated Feb. 4, 2022 for Application No. PCT/US2021/054814.
U.S. Appl. No. 17/346,103, filed Jun. 11, 2021.
U.S. Appl. No. 17/349,763, filed Jun. 16, 2021.
U.S. Appl. No. 63/242,410, filed Sep. 9, 2021.
U.S. Appl. No. 17/410,803, filed Aug. 24, 2021.
U.S. Appl. No. 17/537,107, filed Nov. 29, 2021.
U.S. Appl. No. 17/352,165, filed Jun. 18, 2021.
U.S. Appl. No. 17/352,176, filed Jun. 18, 2021.
U.S. Appl. No. 17/337,146, filed Jun. 2, 2021.
Japanese Office Action for Application No. 2023-504709 dated Dec. 19, 2023.
1 Office Action from Taiwanese Patent Application No. 111120198 dated Jan. 11, 2024 .
U.S. Appl. No. 17/361,178, filed Jun. 28, 2021.
U.S. Appl. No. 63/210,956, filed Jun. 15, 2021.
U.S. Appl. No. 17/475,223, filed Sep. 14, 2021.
U.S. Appl. No. 17/537,314, filed Nov. 29, 2021.
Chinese Office Action for 201880053380.1 dated Dec. 2, 2021.
Taiwan Office Action for 108132682 dated Mar. 24, 2022.
International Search Report/ Written Opinion issued to PCT/US2022/030723 on Sep. 13, 2022.
J. Holma et al. "Measurements on a 20-Layer 12.5 kV Prototype Inductive Adder for the Clic Dr. Kickers", Applied Materials Inc . . . Downloaded on May 26, 2022. 5 pages.
D. Bortis et al. "Optimal Design of a DC Reset Circut for Pulse Transformers", Power Electronic Systems Laboratory (PES), 2007 IEEE.
Landon Collier, "Performance Analysis of an All Solid-State Linear Transformer Driver", IEEE Transactions on Plasma Science, vol. 45, No. 7, Jul. 2017.
"Solid State Linear Transformer Driver (LTD) Development for HPM Sources" Applied Materials Inc. Downloaded on Dec. 1, 2021. 4 pages.
Junfeng Rao et al. "Study on the Basic Characteristics of Solid-State Linear Transformer Drivers", IEEE Transactions On Plasma Science, vol. 48, No. 9, Sep. 2020.
Janne Holma et al. "The Prototype Inductive Adder With Droop Compensation for the CLIC Kicker Systems", IEEE Transactions on Plasma Science, vol. 42, No. 10, Oct. 2014.
"A Solid-State, Inductive-Adder, 10-kV Pulse Generator for Driving Large-Aperture Pockels Cells", LLE Review, vol. 133. 2017.
Haozheng Shi et al. "Design of Inductive Pulsed Current Generator Based on Solid-State Marx Adder", 2016 IEEE.
Li-Min Wang et al. "Development of Five Stage Solid-State Linear Transformer Driver", Cite as: Rev. Sci. Instrum. 91, 094706 (2020); <https://doi.org/10.1063/5.0018088>, Submitted: Jun. 15, 2020 • Accepted: Sep. 6, 2020 • Published Online: Sep. 21, 2020.
International Search Report / Written Opinion Issued To PCT/US2022/040270 on Dec. 1, 2022.
International Search Report dated May 10, 2023 for Application No. PCT/US2023/010024.
Taiwan Office Action issued to Patent Application No. 111130885 on Aug. 16, 2023.

* cited by examiner

PULSED VOLTAGE SOURCE FOR PLASMA PROCESSING APPLICATIONS

CROSS REFERENCE TO RELATED APPLICATIONS

This application is a continuation of U.S. patent application Ser. No. 17/961,452, filed Oct. 6, 2022, which is a continuation of U.S. patent application Ser. No. 17/356,446, filed Jun. 23, 2021, both of which are expressly incorporated herein by reference in their entireties.

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma-assisted etching process to bombard a material formed on a surface of a substrate through openings formed in a patterned mask layer formed on the substrate surface.

With technology node advancing towards 2 nm, the fabrication of smaller features with larger aspect ratios requires atomic precision for plasma processing. For etching processes where the plasma ions play a major role, ion energy control is always challenging the semiconductor equipment industry. In a typical plasma-assisted etching process, the substrate is positioned on an electrostatic chuck (ESC) disposed in a processing chamber, a plasma is formed over the substrate, and ions are accelerated from the plasma towards the substrate across a plasma sheath, i.e., region depleted of electrons, formed between the plasma and the surface of the substrate. Traditionally RF substrate biasing methods, which use sinusoidal RF waveforms to excite the plasma and form the plasma sheath, have been unable to desirably form these smaller device feature sizes. Recently, it has been found that the delivery of high voltage DC pulses to one or more electrodes within a processing chamber can be useful in desirably controlling the plasma sheath formed over the surface of the substrate.

However, producing high voltage pulses with fast rise times and/or fast fall times is challenging. For instance, to achieve a fast rise time and/or a fast fall time (e.g., <2.5 μs) for a high voltage pulse (e.g., >5 kV), the slope of the pulse rise and/or fall must be very steep (e.g., >10 V/s). Such steep rise times and/or fall times are very difficult to produce especially in circuits driving a load with a low capacitance. Such pulse may be especially difficult to produce using standard electrical components in a compact manner; and/or with pulses having variable pulse widths, voltages, and repetition rates; and/or within applications having capacitive loads such as, for example, forming a plasma.

Accordingly, there is a need in the art for pulsed voltage source and biasing methods that are able to enable the completion of a desirable plasma-assisted process on a substrate.

SUMMARY

Embodiments provided herein generally include apparatus, e.g., plasma processing systems, and methods for the plasma processing of a substrate in a processing chamber.

Some embodiments are directed to a waveform generator. The waveform generator generally includes a first voltage stage having: a first voltage source; a first switch; and a second switch, wherein a first terminal of the first voltage source is coupled to a first terminal of the first switch, and wherein a second terminal of the first voltage source is coupled to a first terminal of the second switch. The waveform generator also includes a current stage coupled to a common node between second terminals of the first switch and the second switch, the current stage having a current source and a third switch coupled to the current source.

Some embodiments are directed to a method for waveform generation. The method generally includes incorporating, during a first mode of operation, a first voltage source in an output current path of a waveform generator by controlling multiple switches, and incorporating, during a second mode of operation, a current source in the output current path by controlling the multiple switches. The multiple switches include: a first switch; a second switch, wherein a first terminal of the first voltage source is coupled to a first terminal of the first switch, and wherein a second terminal of the first voltage source is coupled to a first terminal of the second switch; and a third switch coupled in parallel with the current source, the third switch being coupled to a common node between second terminals of the first switch and the second switch.

Some embodiments are directed to an apparatus for waveform generation. The apparatus generally includes a memory, and one or more processors coupled to the memory. The memory and the one or more processors may be configured to: incorporate, during a first mode of operation, a first voltage source in an output current path of a waveform generator by controlling multiple switches; and incorporate, during a second mode of operation, a current source in the output current path by controlling the multiple switches. The multiple switches include: a first switch; a second switch, wherein a first terminal of the first voltage source is coupled to a first terminal of the first switch, and wherein a second terminal of the first voltage source is coupled to a first terminal of the second switch; and a third switch coupled in parallel with the current source, the third switch being coupled to a common node between second terminals of the first switch and the second switch.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

DETAILED DESCRIPTION

Certain aspects of the present disclosure are generally directed to techniques for generating a voltage waveform for a plasma processing system. During the plasma processing of a substrate the voltage waveform, which is provided to an electrode disposed within a plasma processing chamber, will typically be configured to include a sheath collapse stage and an ion current stage. The sheath collapse stage may be implemented by generating a positive voltage (e.g., 100 volts) to be used to collapse a sheath generated over a surface of the substrate disposed on a substrate support positioned in a processing chamber. During the ion current stage, ions within the processing chamber may begin to flow by generating a negative voltage (e.g., −1600 volts). In some embodiments, a voltage during the ion current stage of the waveform may have a ramp to implement current compensation, as described in more detail herein. The voltage waveform may be generated by selectively incorporating various voltage sources (e.g., capacitive element) in an output current path of a waveform generator.

Plasma Processing System Examples

Figure 1:
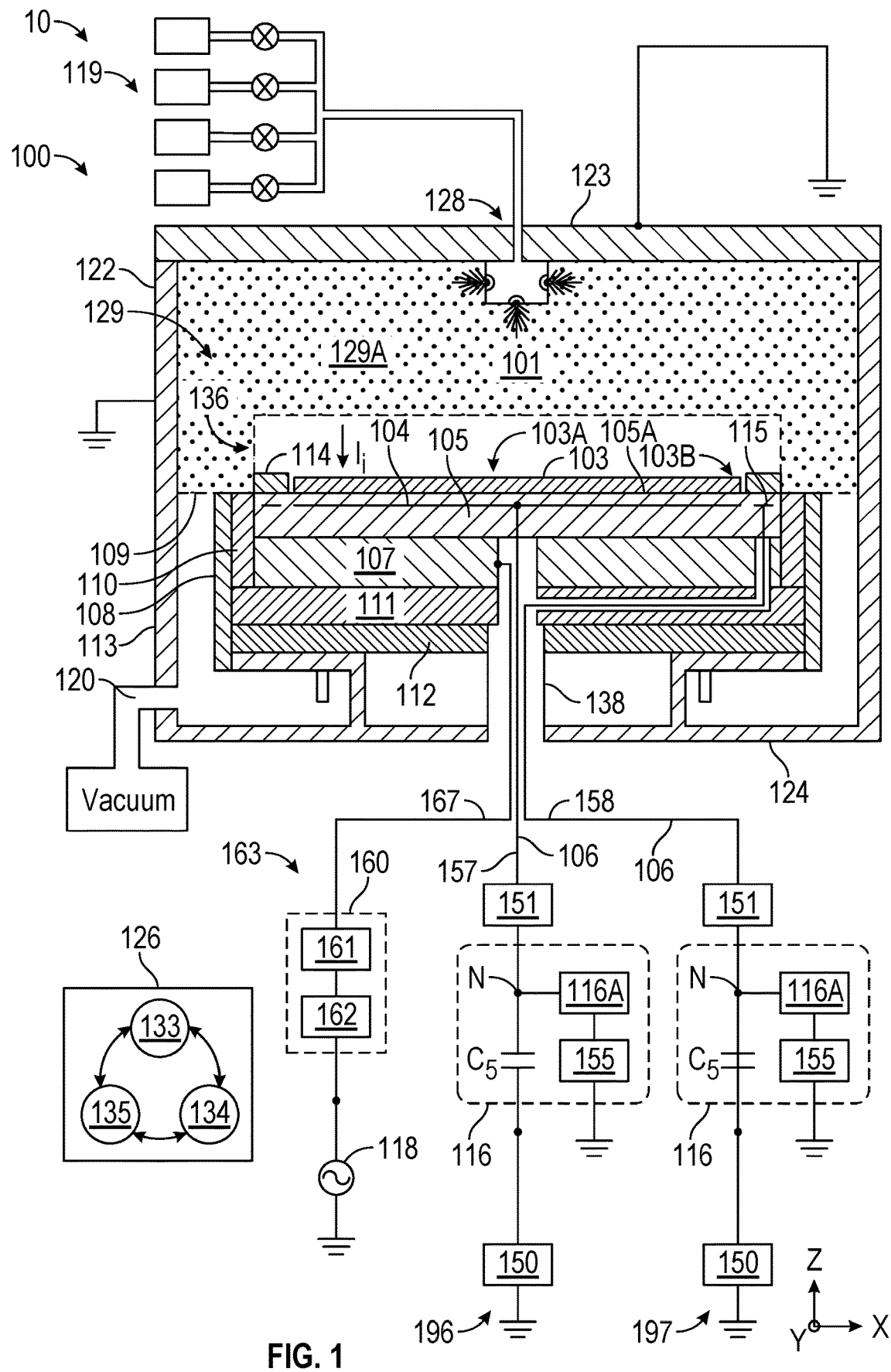
FIG. 1 is a schematic cross-sectional view of a processing system, according to one or more embodiments, configured to practice the methods set forth herein.

FIG. 1 is a schematic cross-sectional view of a processing system 10 configured to perform one or more of the plasma processing methods set forth herein. In some embodiments, the processing systems 10 is configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown, the processing system 10 is configured to form a capacitively coupled plasma (CCP), where the processing chamber 100 includes an upper electrode (e.g., chamber lid 123) disposed in a processing volume 129 facing a lower electrode (e.g., the substrate support assembly 136) also disposed in the processing volume 129. In a typical capacitively coupled plasma (CCP) processing system, a radio frequency (RF) source (e.g., RF generator 118) is electrically coupled to one of the upper or lower electrode, and delivers an RF signal configured to ignite and maintain a plasma (e.g., the plasma 101). In this configuration, the plasma is capacitively coupled to each of the upper and lower electrodes and is disposed in a processing region therebetween. Typically, the opposing one of the upper or lower electrodes is coupled to ground or to a second RF power source. One or more components of the substrate support assembly 136, such as the support base 107 is electrically coupled to a plasma generator assembly 163, which includes the RF generator 118, and the chamber lid 123 is electrically coupled to ground. As shown, the processing system 10 includes a processing chamber 100, a support assembly 136, and a system controller 126.

The processing chamber 100 typically includes a chamber body 113 that includes the chamber lid 123, one or more sidewalls 122, and a chamber base 124, which collectively define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 disposed through the chamber lid 123 is used to deliver one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103.

The system controller 126, also referred to herein as a processing chamber controller, includes a central processing unit (CPU) 133, a memory 134, and support circuits 135. The system controller 126 is used to control the process sequence used to process the substrate 103, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10.

Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10 to perform the various process tasks and various process sequences used to implement the methods described herein. In one embodiment, the program includes instructions that are used to perform one or more of the operations described below in relation to FIG. 7.

The processing system may include a plasma generator assembly 163, a first pulsed voltage (PV) source assembly 196 for establishing a first PV waveform at a bias electrode 104, and a second PV source assembly 197 for establishing a second PV waveform at an edge control electrode 115. The first PV waveform or the second PV waveform may be generated using a waveform generator as described in more detail herein with respect to FIGS. 4, 5A, and 5B. In some embodiments, the plasma generator assembly 163 delivers an RF signal to the support base 107 (e.g., power electrode or cathode) which may be used to generate (maintain and/or ignite) a plasma 101 in a processing region disposed between the substrate support assembly 136 and the chamber lid 123. In some embodiments, the RF generator 118 is configured to deliver an RF signal having a frequency that is greater than 1 MHz or more, or about 2 MHz or more, such as about 13.56 MHz or more.

As discussed above, in some embodiments, the plasma generator assembly 163, which includes an RF generator 118 and an RF generator assembly 160, is generally configured to deliver a desired amount of a continuous wave (CW) or pulsed RF power at a desired substantially fixed sinusoidal waveform frequency to a support base 107 of the substrate support assembly 136 based on control signals provided from the system controller 126. During processing, the plasma generator assembly 163 is configured to deliver RF power (e.g., an RF signal) to the support base 107 disposed proximate to the substrate support 105, and within the substrate support assembly 136. The RF power delivered to the support base 107 is configured to ignite and maintain a processing plasma 101 of processing gases disposed within the processing volume 129.

In some embodiments, the support base 107 is an RF electrode that is electrically coupled to the RF generator 118 via an RF matching circuit 162 and a first filter assembly 161, which are both disposed within the RF generator assembly 160. The first filter assembly 161 includes one or more electrical elements that are configured to substantially prevent a current generated by the output of a PV waveform generator 150 from flowing through an RF power delivery line 167 and damaging the RF generator 118. The first filter assembly 161 acts as a high impedance (e.g., high Z) to the PV signal generated from a PV pulse generator P1 within the PV waveform generator 150, and thus inhibits the flow of current to the RF matching circuit 162 and RF generator 118.

In some embodiments, the RF generator assembly 160 and RF generator 118 are used to ignite and maintain a processing plasma 101 using the processing gases disposed in the processing volume 129 and fields generated by the RF power (RF signal) delivered to the support base 107 by the RF generator 118. The processing volume 129 is fluidly coupled to one or more dedicated vacuum pumps through a vacuum outlet 120, which maintain the processing volume 129 at sub-atmospheric pressure conditions and evacuate processing and/or other gases, therefrom. In some embodiments, the substrate support assembly 136, disposed in the processing volume 129, is disposed on a support shaft 138 that is grounded and extends through the chamber base 124. However, in some embodiments, the RF generator assembly 160 is configured to deliver an RF power to the bias electrode 104 disposed in the substrate support 105 versus the support base 107.

The substrate support assembly 136, as briefly discussed above, generally includes the substrate support 105 (e.g., ESC substrate support) and support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing.

Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof. In some embodiments, one or more characteristics of the RF power used to maintain the plasma 101 in the processing region over the bias electrode 104 are determined and/or monitored by measuring an RF waveform established at the bias electrode 104.

In one configuration, the bias electrode 104 is a chucking pole used to secure (i.e., chuck) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

In some embodiments, the bias electrode 104 is electrically coupled to a clamping network 116, which provides a chucking voltage thereto, such as static DC voltage between about −5000 V and about 5000 V, using an electrical conductor, such as the coaxial power delivery line 106 (e.g., a coaxial cable). As will be discussed further below, the clamping network 116 includes bias compensation circuit elements 116A, a DC power supply 155, and a bias compensation module blocking capacitor, which is also referred to herein as the blocking capacitor $C_5$. The blocking capacitor $C_5$ is disposed between the output of a pulsed voltage (PV) waveform generator 150 and the bias electrode 104.

The substrate support assembly 136 may further include the edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 1, the edge control electrode 115 is positioned within a region of the substrate support 105. In some embodiments, as illustrated in FIG. 1, the edge control electrode 115 includes a conductive mesh, foil, and/or plate that is disposed a similar distance (i.e., Z-direction) from the substrate supporting surface 105A of the substrate support 105 as the bias electrode 104. In some other embodiments, the edge control electrode 115 includes a conductive mesh, foil, and/or plate that is positioned on or within a region of a quartz pipe 110, which surrounds at least a portion of the bias electrode 104 and/or the substrate support 105. Alternately, in some other embodiments (not shown), the edge control electrode 115 is positioned within or is coupled to the edge ring 114, which is disposed on and adjacent to the substrate support 105. In this configuration, the edge ring 114 is formed from a semiconductor or dielectric material (e.g., AlN, etc.).

The edge control electrode 115 can be biased by use of a PV waveform generator that is different from the PV waveform generator 150 that is used to bias the bias electrode 104. In some embodiments, the edge control electrode 115 can be biased by use of a PV waveform generator 150 that is also used to bias the bias electrode 104 by splitting part of the power to the edge control electrode 115. In one configuration, a first PV waveform generator 150 of the first PV source assembly 196 is configured to bias the bias electrode 104, and a second PV waveform generator 150 of a second PV source assembly 197 is configured to bias the edge control electrode 115.

A power delivery line 157 electrically connects the output of the PV waveform generator 150 of the first PV source assembly 196 to an optional filter assembly 151 and the bias electrode 104. While the discussion below primarily discusses the power delivery line 157 of the first PV source assembly 196, which is used to couple a PV waveform generator 150 to the bias electrode 104, the power delivery line 158 of the second PV source assembly 197, which couples a PV waveform generator 150 to the edge control electrode 115, will include the same or similar components. The electrical conductor(s) within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e). The optional filter assembly 151 includes one or more electrical elements that are configured to substantially prevent a current generated by the output of the RF generator 118 from flowing through the power delivery line 157 and damaging the PV waveform generator 150. The optional filter assembly 151 acts as a high impedance (e.g., high Z) to RF signal generated by the RF generator 118, and thus inhibits the flow of current to the PV waveform generator 150.

The second PV source assembly 197 includes a clamping network 116 so that a bias applied to the edge control electrode 115 can be similarly configured to the bias applied to the bias electrode 104 by the clamping network 116 coupled within the first PV source assembly 196. Applying similarly configured PV waveforms and clamping voltages to the bias electrode 104 and edge control electrode 115 can help improve the plasma uniformity across the surface of the substrate during processing and thus improve the plasma processing process results.

In some embodiments, the processing chamber 100 further includes the quartz pipe 110, or collar, that at least partially circumscribes portions of the substrate support assembly 136 to prevent the substrate support 105 and/or the support base 107 from contact with corrosive processing gases or plasma, cleaning gases or plasma, or byproducts thereof. Typically, the quartz pipe 110, the insulator plate 111, and the ground plate 112 are circumscribed by a liner 108. In some embodiments, a plasma screen 109 is positioned between the cathode liner 108 and the sidewalls 122 to prevent plasma from forming in a volume underneath the plasma screen 109 between the liner 108 and the one or more sidewalls 122.

Example Representative Circuit of a Processing Chamber

Figure 2:
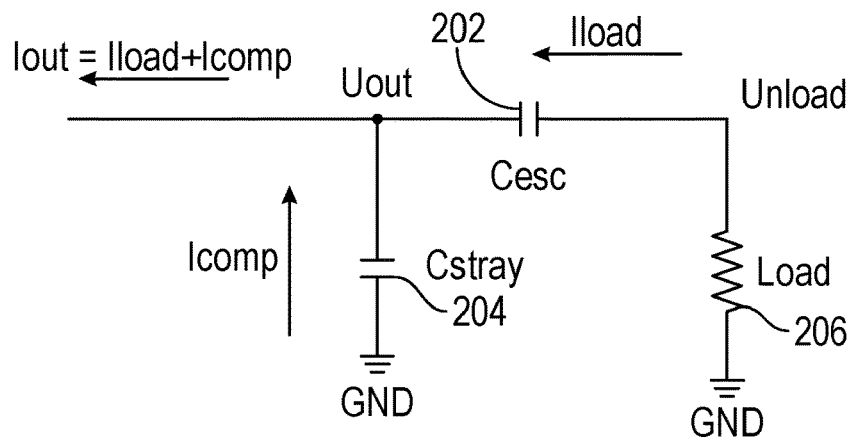
FIG. 2 illustrates stray capacitance and substrate support capacitance associated with a processing chamber.

FIG. 2 illustrates stray capacitance and escape capacitance associated with a processing chamber. The stray capacitance 204 ($C_{stray}$) represents the capacitance between an electrode of the processing chamber and ground, and a substrate support capacitance 202, also referred to herein as an electrostatic chuck capacitance ($C_{esc}$), which represents the capacitance between the bias electrode 104 and the substrate supporting surface 105A. As shown, $C_{esc}$ is coupled between an output node (labeled $U_{out}$) and a load represented by resistive element 206. To have a square shape for a voltage pulse on the load (e.g., at node $U_{load}$), a slope is implemented for the voltage across $C_{esc}$ and the voltage across $C_{stray}$ (e.g., voltage at $U_{out}$), as described in more detail herein. The current across $C_{stray}$ (e.g., compensation current ($I_{comp}$)) may be equal to the load current ($I_{load}$) across $C_{esc}$ multiplied by the ratio of the capacitance of $C_{stray}$ and the capacitance of $C_{esc}$. The output current ($I_{out}$) may be equal to the sum of $I_{load}$ and Icomp, which may be represented by the equation:

$$Iout = Iload\left(1 + \frac{Cstray}{Cesc}\right)$$

Example Voltage Waveform for Processing Chamber

Figure 3A:
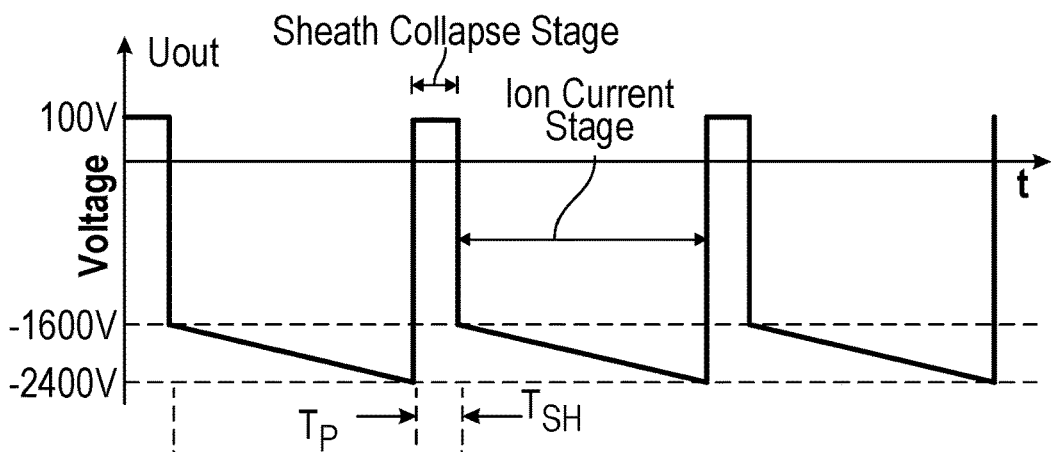
FIGS. 3A 3B, and 3C show example voltage waveforms for plasma processing.
Figure 3B:
Figure 3C:

FIG. 3A shows a voltage waveform that may be established at an electrode disposed within a processing chamber, such as the electrode 104 shown in FIG. 1. The waveform includes two stages, an ion current stage and a sheath collapse stage. At the beginning of the ion current stage, a drop of wafer voltage creates a high voltage sheath above the substrate, accelerating positive ions to the substrate 103. The positive ions deposit a positive charge on the substrate surface and tend to gradually increase the substrate voltage positively. If a square wave is supplied, the ion current towards the substrate creates a positive slope of the substrate voltage (e.g., at $U_{load}$ shown in FIG. 2). To have a square shape for the voltage pulse on the load (e.g., at $U_{load}$) as shown in FIG. 3C, a slope is implemented for the voltage at $U_{out}$ during the ion current stage, as shown in FIG. 3A, is used to form the voltage across the electrostatic chuck capacitive element $C_{esc}$, as shown in FIG. 3B. Implementing the slope at the electrode 104 and electrostatic chuck capacitor $C_{esc}$ during the ion current stage is generally referred to as current compensation, which is used to form the constant voltage seen at $U_{load}$ during this stage. The voltage difference between the beginning and end of the ion current phase determines the ion energy distribution function (IEDF) width. The larger the voltage difference, the wider the distribution of ion energies, and thus a wider IEDF width. To achieve monoenergetic ions and a narrower IEDF width, current compensation operations are performed to flatten the substrate voltage waveform in the ion current phase. In some embodiments, the voltage waveforms can be delivered at a frequency ($1/T_p$) between about 50 kHz and 1000 kHz. In some embodiments, voltage waveform established at the electrode has an on-time, which is defined as the ratio of the ion current time period (e.g., length of ion current stage) and the waveform period $T_P$ (e.g., length of sheath collapse stage+length of ion current stage), is greater than 50%, or greater than 70%, such as between 80% and 95%. In some embodiments, a voltage waveform, which has a waveform cycle has a period $T_P$ (e.g., about 2.5 µs), is serially repeated within a waveform burst that has a burst period that is between about 100 microseconds (µs) and about 10 milliseconds (ms). The burst of PV waveforms can have a burst duty cycle that is between about 5%-100%, such as between about 50% and about 95%, wherein the duty cycle is the ratio of the burst period divided by the burst period plus a non-burst period (i.e., no PV waveforms are generated) that separates the burst periods. As shown, the sheath collapse stage may have a duration of $T_{SH}$, which may be about 200 ns.

Figure 4:
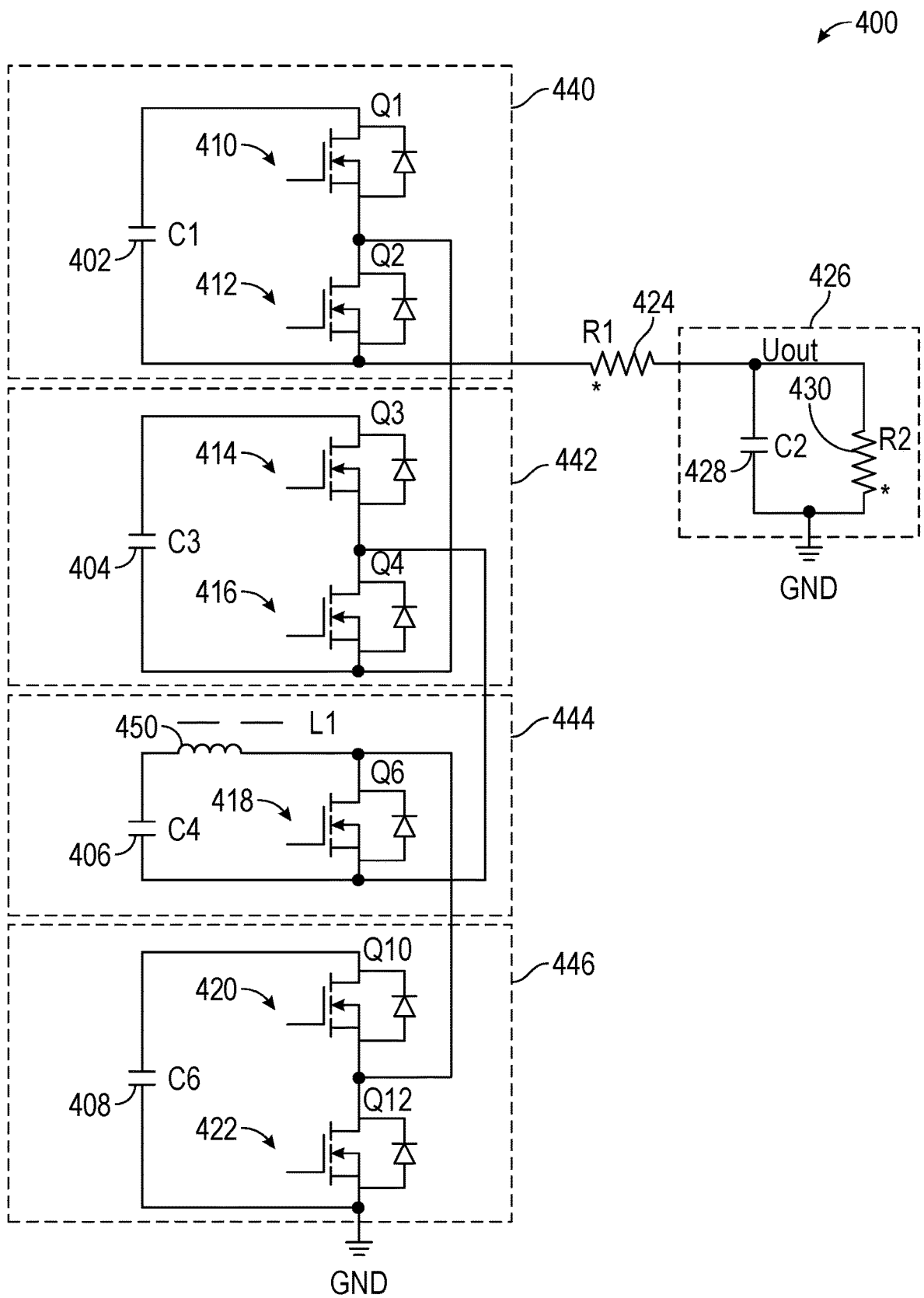
FIG. 4 illustrates a pulser, in accordance with certain embodiments of the present disclosure.
Figure 5A:
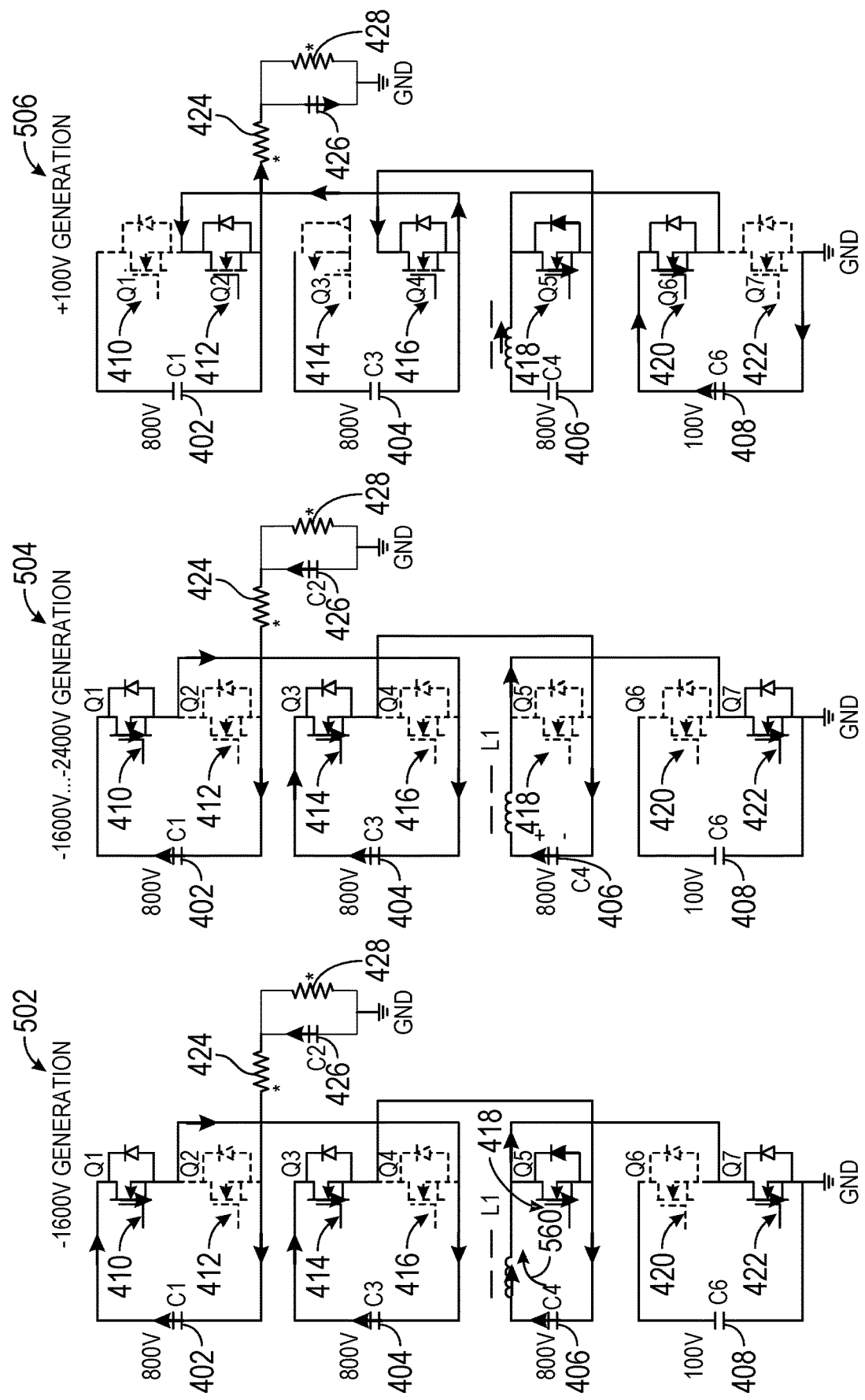
FIG. 5A illustrates various modes of operation of a pulser, in accordance with certain embodiments of the present disclosure.
Figure 6:
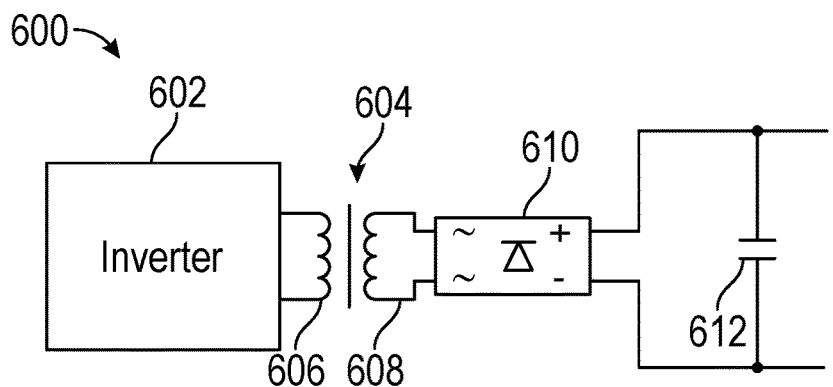
FIG. 6 illustrates a charging circuit used to charge a capacitive element, in accordance with certain aspects of the present disclosure.

FIG. 4 illustrates a pulser 400 (also referred to herein as a waveform generator), in accordance with certain embodiments of the present disclosure. As shown, the pulser 400 may include pulse capacitive elements 402, 404, 406, and 408 (labeled C1, C3, C4, and C6), as well as transistors 410, 412, 414, 416, 418, 420, 422 (labeled as transistors Q1, Q2, Q3, Q4, Q6, Q10, and Q12). Transistors 410, 412, 414, 416, 418, 420, 422 (also referred to herein as switches) may be power transistors (e.g., metal-oxide-semiconductor field-effect transistors (MOSFETs)) with a parallel diode (e.g., a body diode). Transistors 410, 412, 414, 416, 418, 420, 422 may be used to select a current flow path (also referred to as an output current path) for the pulser as described in more detail herein. Capacitive elements 402, 404, 406, and 408 may serve as voltage storage elements that may be charged using a charging circuit, such as the circuit illustrated in FIG. 6. The capacitive elements illustrated in FIGS. 4, 5A and 6, are in effect acting as voltage sources. While the example pulser 400 illustrates capacitive elements to facilitate understanding, any suitable voltage source may be used.

The resistive element 424 (labeled R1) represents an internal serial resistive element of the pulser coupled to the load 426. The load 426, which may be a plasma formed in plasma processing chamber, may be represented by capacitive element 428 (labeled C2) and resistive element 430 (labeled R2). As shown, the capacitive element 402 and transistors 410, 412 form a first voltage stage 440, and the capacitive element 404 and transistors 414, 416 for a second voltage stage 442. The pulser 400 also includes a current stage 444 having the capacitive element 406, the transistor 418, and an inductive element 450, as well as a third voltage stage 446 having the capacitive element 408 and transistors 420, 422. While the pulser 400 is implemented with three voltage stages, the aspects of the present disclosure may be implemented with one, two, or more than three voltage stages. In some embodiments of a pulser 400, one or more of the voltage stages may be duplicated one or more times, such as a configuration that includes a first voltage stage 440, two or more second voltage stages 442, a current stage 444, and a third voltage stage 446, wherein the two or more second voltage stages 442 are connected in series between the first voltage stage 440 and the current stage 444.

As shown, each of the capacitive elements 402, 404, 406, and 408 may be charged to a specific voltage, depending on the waveform being implemented. For example, each of the capacitive elements 402, 404, 406 are charged to 800 volts, and capacitive element 408 is charged to 100 volts. In some implementations, the capacitive elements 402, 404, 406, 408 may be charged to greater or lower voltages to implement different voltages levels for a waveform suitable for different implementations. In some embodiments, each of the voltage stages 440, 442, 446 and current stage 444 may have a modular design that facilitates easy replacement in case of malfunction. The operation of the pulser 400 for generating the waveform shown in FIG. 3A is described in more detail with respect to FIG. 5.

Figure 5B:
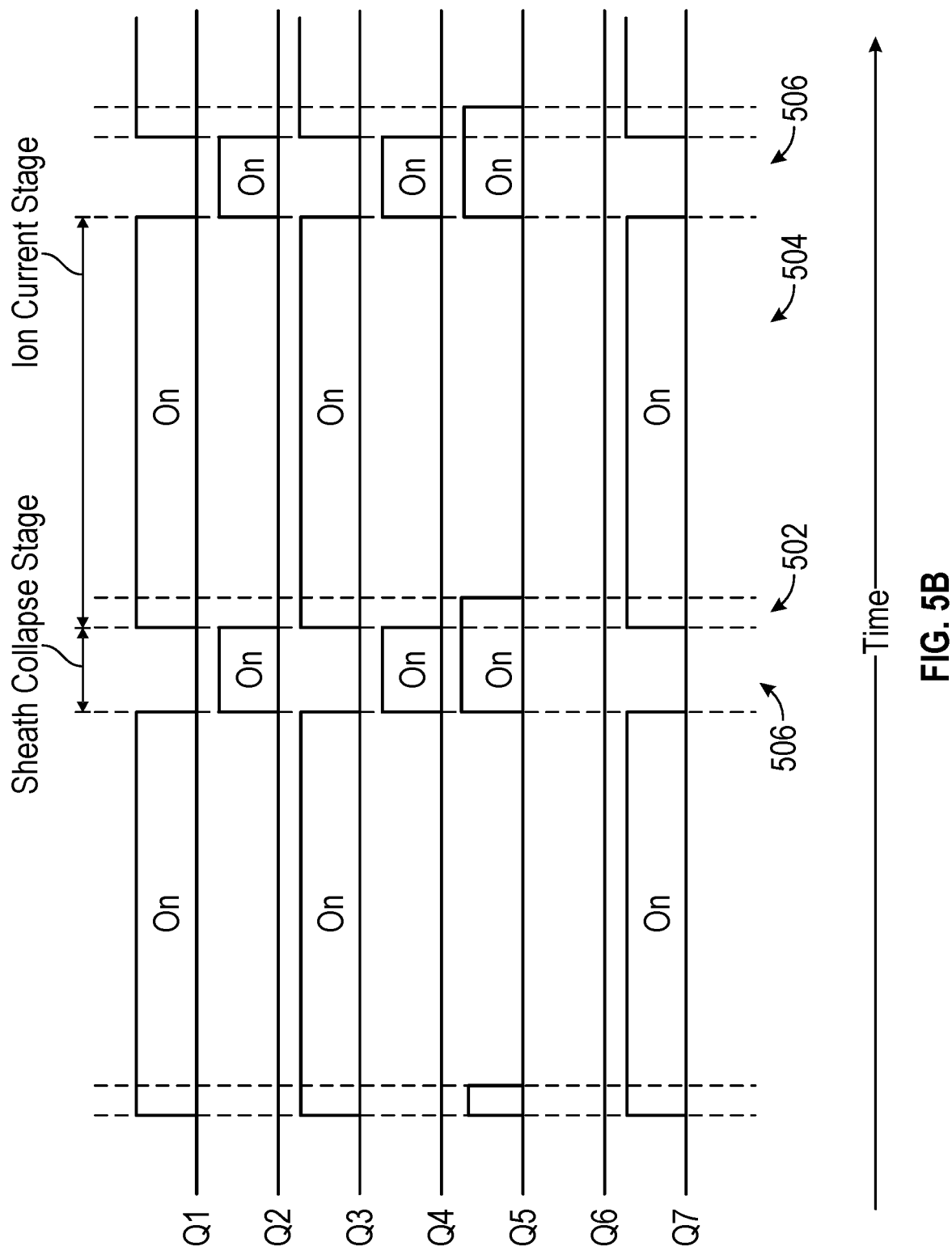
FIG. 5B is a timing diagram showing states of switches of the pulser during various modes of operation, in accordance with certain embodiments of the present disclosure.

FIG. 5A illustrates various modes of operation of the pulser 400, in accordance with certain embodiments of the present disclosure. The magnitudes of the voltages associated with the various modes of operation 502, 504, 506 and circuit elements illustrated in FIG. 5A are intended to provide examples of voltages that may be established during the generation of a pulsed waveform and are not intended to be limiting as to the scope of the disclosure provided herein. FIG. 5B is a timing diagram showing a state of each of transistors 410, 412, 414, 416, 418, 420, 422 (e.g., transistors Q1, Q2, Q3, Q4, Q6, Q10, and Q12). During the sheath collapse stage, the voltage at $U_{out}$ may be set to 100 volts, as an example. To transition from the sheath collapse stage to the ion current stage, transistors Q1, Q3, Q5, and Q7 may be turned on and transistors Q2, Q4, Q6 may be turned off to implement a voltage drop from 100 volts to −1600 volts, as shown by mode of operation 502. Turning on transistors Q1, Q3, Q5, and Q7 and turning off transistors Q2, Q4, Q6 effectively incorporates the capacitive elements 402, 404 in the output current path of the pulser, as shown. In the mode of operation 502, $I_{out}$ flows from ground through capacitive elements C2, C1, transistor Q1, capacitive element C3, and transistors Q3, Q5, and Q7. The capacitive elements C1 and C3 set the voltage at $U_{out}$ to −1600 volts (e.g., −800 volts from capacitive element C1 and −800 volts from capacitive element C3). While two voltage stages are used to implement the −1600 volts during the ion current stage, each voltage stage providing −800 volts, a single voltage stage may be used. For example, the capacitive element of the single voltage stage may be charged to 1600 volts to provide the −1600 volts at $U_{out}$ during the ion current stage. As shown, during the mode of operation 502, $I_{out}$ flows across the parallel diode (e.g., body diode) of transistor Q5, and flows across transistor Q7 back to ground. With transistor Q5 being turned on, current 560 flows in a loop through capacitive element C4, inductive element L1, and from the drain to source of transistor Q5.

Once the voltage at $U_{out}$ reaches −1600 volts, the mode of operation 504 may be implemented. During mode of operation 504, a current source, implemented using capacitive element C4 and inductive element L1, may be incorporated in the output current path of the pulser 400. As shown, transistor Q5 may be turned off, and $I_{out}$ will begin to flow across capacitive element C4 and inductive element L1 (e.g., instead of through the parallel diode of transistor Q5 during mode of operation 502). Capacitive element C4 and inductive element L1 implement a current source, effectively gradually decreasing the voltage at $U_{out}$ to implement the slope during the ion current stage for ion current compensation, as described with respect to FIG. 3A. For example, during the ion current stage, the voltage at $U_{out}$ may decrease from −1600 volts to −2400 volts.

Once the voltage at $U_{out}$ has reached −2400 voltages, the mode of operation 506 may be implemented. During mode of operation 506, capacitive element C6 may be incorporated in the output current path of pulser 400. As shown, during the mode of operation 506, transistors Q1, Q3, and Q7 may be turned off and transistors Q2, Q4, Q5, Q6 may be turned on. Thus, $I_{out}$ flows through capacitive element C6, transistors Q6, Q5, Q4, Q2, and capacitive element C2. As described, capacitive element C6 may be charged to 100 volts. Therefore, the mode of operation 506 implements the 100 volts at $U_{out}$ during the sheath collapse stage, as described with respect to FIG. 3A. In other words, $I_{out}$ flows in the opposite direction during mode of operation 506 (e.g., during the sheath collapse stage) as compared to modes of operation 502, 504 (e.g., during ion current stage), such that a positive voltage (e.g., 100 volts) is implemented during the sheath collapse stage and a negative voltage (e.g., between −1600 volts to −2400 volts) during the ion current stage.

FIG. 6 illustrates a charging circuit 600 used to charge a capacitive element 612, in accordance with certain aspects of the present disclosure. The capacitive element 612 may correspond to any one of capacitive elements 402, 404, 406, and 408. In other words, a charging circuit (e.g., similar to charging circuit 600) may be implemented for each of capacitive elements 402, 404, 406, and 408 to charge the capacitive elements to their respective voltages, as described herein. The charging circuit 600 may include an inverter 602 for converting a direct current (DC) voltage to an alternating current (AC) voltage. The AC voltage may be provided to a primary winding 606 of a transformer 604. The transformer may generate an AC voltage at the secondary winding 608 having a higher voltage than the AC voltage at the primary winding 606. For example, to charge capacitive element 402, the AC voltage at the secondary winding 608 may have a peak voltage of 800 volts. The AC voltage at the secondary winding 608 may be provided to a rectifier 610 to generate a DC signal used to charge the capacitive element 612.

Figure 7:
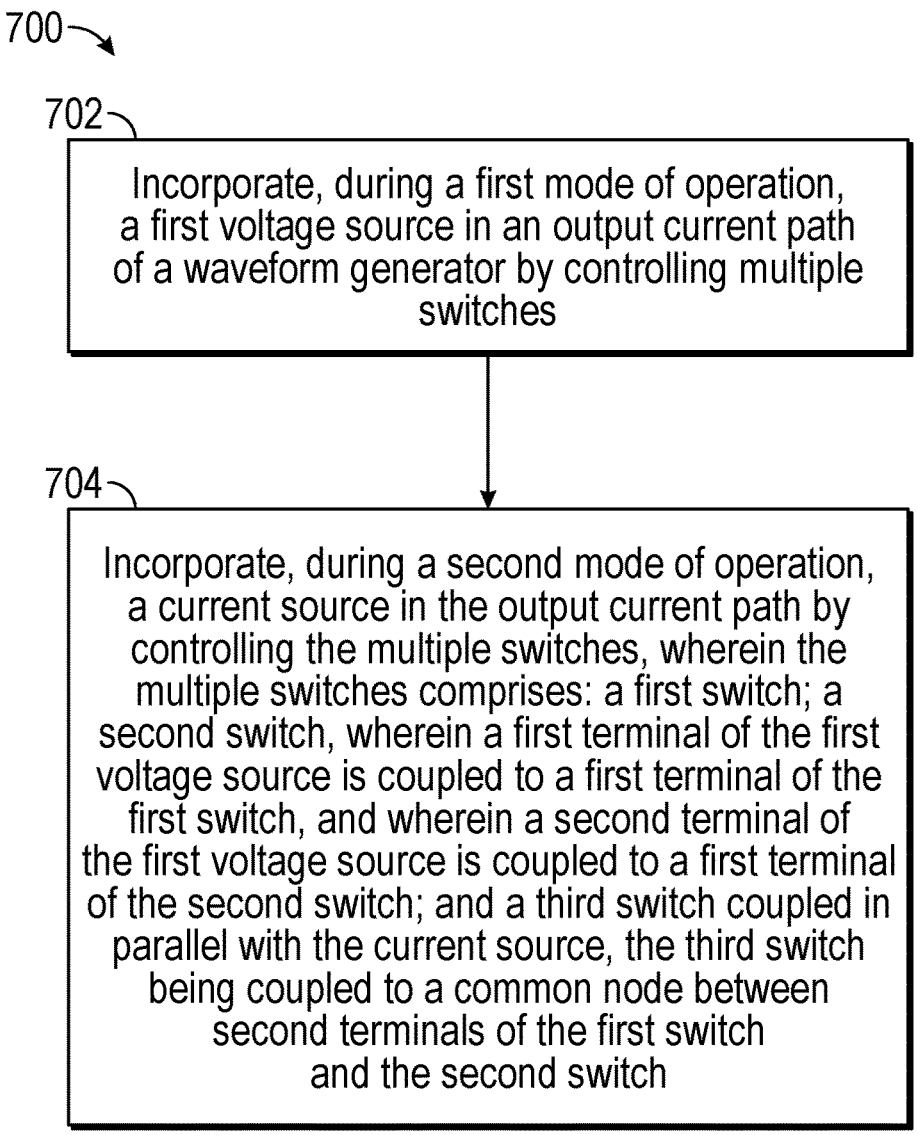
FIG. 7 is a process flow diagram illustrating a method of waveform generation, in accordance with certain embodiments of the present disclosure.

FIG. 7 is a process flow diagram illustrating a method 700 of waveform generation, in accordance with certain embodiments of the present disclosure. The method 700 may be performed by a waveform generation system, including a waveform generator such as the pulser 400 and/or control circuitry such as the system controller 126.

At activity 702, the waveform generation system incorporates, during a first mode of operation (e.g., mode of operation 502), a first voltage source (e.g., capacitive element 402) in an output current path of a waveform generator (e.g., pulser 400) by controlling multiple switches. At activity 704, the waveform generation system incorporates, during a second mode of operation (e.g., mode of operation 504), a current source (e.g., inductive element 450 and capacitive element 406) in the output current path by controlling the multiple switches.

In some embodiments, the multiple switches include a first switch (e.g., transistor 410 or transistor 414) and a second switch (e.g., transistor 412 or transistor 416). A first terminal of the first voltage source (e.g., capacitive element 402 or capacitive element 404) is coupled to a first terminal of the first switch, and a second terminal of the first voltage source is coupled to a first terminal of the second switch. In some embodiments, the multiple switches also include a third switch (e.g., transistor 418) coupled in parallel with the current source. The third switch may be coupled to a common node between second terminals of the first switch and the second switch. In some embodiments, incorporating the first voltage source in the output current path may include closing the first switch, opening the second switch, and closing the third switch. Incorporating the current source in the output current path may include closing the first switch, opening the second switch, and opening the third switch.

In some embodiments, the waveform generation system incorporates, during the first mode of operation (e.g., mode of operation 502), a second voltage source (e.g., capacitive element 404) in the output current path by controlling the multiple switches. The multiple switches may further include a fourth switch (e.g., transistor 414) and a fifth switch (e.g., transistor 416). A first terminal of the second voltage source may be coupled to a first terminal of the fourth switch, a second terminal of the second voltage source may be coupled to a first terminal of the fifth switch, and a common node between second terminals of the fourth switch and the fifth switch may be coupled to the second switch (e.g., transistor 412) or the third switch (e.g., transistor 418). In some embodiments, incorporating the second voltage source in the output current path may include closing the fourth switch and opening the fifth switch.

In some embodiments, the waveform generation system may also incorporate, during a third mode of operation (e.g., mode of operation 506), a third voltage source (e.g., capacitive element 408) in the output current path by controlling the multiple switches. The multiple switches may include a sixth switch (e.g., transistor 420) and a seventh switch (e.g., transistor 422). A first terminal of the third voltage source may be coupled to a first terminal of the sixth switch, a second terminal of the third voltage source may be coupled to a first terminal of the seventh switch, and a common node between second terminals of the sixth switch and the seventh switch may be coupled to the third switch (e.g., transistor 418). In some embodiments, incorporating the third voltage source in the output current path may include closing the sixth switch and opening the seventh switch. The sixth switch may be open and the seventh switch may be closed during the first mode of operation and the second mode of operation. In some embodiments, a voltage associated with the first voltage source or the second voltage source (e.g., 600 volts) is greater than a voltage associated with the third voltage source (e.g., 100 volts).

The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A waveform generator, comprising:
   a first voltage stage, comprising:
   a first voltage source;
   a first switch; and
   a second switch, wherein:
   a first terminal of the first voltage source is coupled to a first terminal of the first switch;
   a second terminal of the first voltage source is coupled to a first terminal of the second switch and an output node of the waveform generator;
   the second switch is disposed between a first node and the output node, wherein the first terminal of the second switch and the second terminal of the first voltage source are directly connected with the output node;
   a second terminal of the first switch is coupled to the first node and a second terminal of the second switch; and
   the output node is configured to be coupled to a load; and
   a second voltage stage coupled between the first node and a ground node, wherein the first node is disposed between the second terminals of the first switch and the second switch, wherein the first voltage stage is connected with the output node, and wherein the second voltage stage is coupled to the output node through the first voltage stage.

2. The waveform generator of claim 1, wherein the first voltage source comprises a capacitive element.

3. The waveform generator of claim 1, wherein each of the first switch and the second switch comprise a transistor.

4. A waveform generator, comprising:
a first voltage stage, comprising:
  a first voltage source;
  a first switch; and
  a second switch, wherein:
    a first terminal of the first voltage source is coupled to a first terminal of the first switch;
    a second terminal of the first voltage source is coupled to a first terminal of the second switch and an output node of the waveform generator;
    the second switch is disposed between a first node and the output node;
    a second terminal of the first switch is coupled to the first node and a second terminal of the second switch; and
    the output node is configured to be coupled to a load; and
a second voltage stage coupled between the first node and a ground node, wherein the first node is disposed between the second terminals of the first switch and the second switch, wherein the first voltage stage is connected with the output node, and wherein the second voltage stage is coupled to the output node through the first voltage stage;
a current stage coupled to the second voltage stage, the current stage comprising:
  a current source; and
  a third switch coupled to the current source, wherein the current source is coupled in parallel with the third switch,
wherein the current source comprises:
  a capacitive element; and
  an inductive element coupled in series with the capacitive element.

5. The waveform generator of claim 4, further comprising a diode coupled between a first terminal and a second terminal of the third switch.

6. The waveform generator of claim 5, wherein the diode comprises a body diode of the first switch.

7. The waveform generator of claim 1, wherein:
the first voltage source comprises a first capacitive element; and
the waveform generator further comprises one or more charging circuits configured to charge the first capacitive element.

8. The waveform generator of claim 7, wherein the second voltage stage comprises:
  a second voltage source;
  a third switch; and
  a fourth switch, wherein:
    a first terminal of the second voltage source is coupled to a first terminal of the third switch;
    a second terminal of the second voltage source is coupled to a first terminal of the fourth switch and the first node;
    the fourth switch is disposed between a second node and the first node; and
    the second node is coupled to the ground node, a second terminal of the third switch, and a second terminal of the fourth switch.

9. The waveform generator of claim 1, wherein the load comprises a plasma formed in a processing chamber.

10. A waveform generator, comprising:
a first voltage stage, comprising:
  a first voltage source;
  a first switch; and
  a second switch, wherein:
    a first terminal of the first voltage source is coupled to a first terminal of the first switch;
    a second terminal of the first voltage source is coupled to a first terminal of the second switch and an output node of the waveform generator;
    the second switch is disposed between a first node and the second terminal of the first voltage source, wherein the first terminal of the second switch and the second terminal of the first voltage source are directly connected with the output node;
    a second terminal of the first switch is coupled to the first node and a second terminal of the second switch; and
    the output node is configured to be coupled to a load;
a second voltage stage coupled between the first node and a ground node, wherein the first node is disposed between the second terminals of the first switch and the second switch; and
a current stage coupled between the second voltage stage and the ground node.

11. The waveform generator of claim 10, wherein the first voltage source comprises a capacitive element.

12. The waveform generator of claim 10, wherein each of the first switch and the second switch comprise a transistor.

13. The waveform generator of claim 10, wherein the current stage comprises:
  a current source; and
  a third switch coupled to the current source, wherein the current source is coupled in parallel with the third switch.

14. The waveform generator of claim 13, wherein the current source comprises:
  a capacitive element; and
  an inductive element coupled in series with the capacitive element.

15. The waveform generator of claim 14, further comprising a diode coupled between a first terminal and a second terminal of the third switch.

16. The waveform generator of claim 15, wherein the diode comprises a body diode of the third switch.

17. The waveform generator of claim 10, wherein:
the first voltage source comprises a first capacitive element; and
the waveform generator further comprises one or more charging circuits configured to charge the first capacitive element.

18. The waveform generator of claim 10, wherein the second voltage stage comprises:
  a second voltage source;
  a third switch; and
  a fourth switch, wherein:
    a first terminal of the second voltage source is coupled to a first terminal of the third switch;
    a second terminal of the second voltage source is coupled to a first terminal of the fourth switch and the first node;
    the fourth switch is disposed between a second node and the first node; and
    the second node is coupled to the ground node, a second terminal of the third switch, and a second terminal of the fourth switch.

19. The waveform generator of claim 10, wherein the load comprises a plasma formed in a processing chamber.

* * * * *